(12) United States Patent
Matsumoto

(10) Patent No.: US 8,399,821 B2
(45) Date of Patent: Mar. 19, 2013

(54) LIGHT SOURCE INTEGRATED PHOTOELECTRIC CONVERSION APPARATUS

(75) Inventor: Tomotaka Matsumoto, Matsumoto (JP)

(73) Assignee: Seiko Epson Corporation, Tokyo (JP)

( * ) Notice: Subject to any disclaimer, the term of this patent is extended or adjusted under 35 U.S.C. 154(b) by 335 days.

(21) Appl. No.: 12/634,155

(22) Filed: Dec. 9, 2009

(65) Prior Publication Data

US 2010/0155578 A1 Jun. 24, 2010

(30) Foreign Application Priority Data

Dec. 24, 2008 (JP) ................................ 2008-327472

(51) Int. Cl.
*H01L 31/00* (2006.01)
*H01L 27/00* (2006.01)
(52) U.S. Cl. ................... 250/214.1; 250/208.1; 257/435
(58) Field of Classification Search .............. 250/208.1, 250/214.1, 216, 205, 226; 257/80–84, 431–435
See application file for complete search history.

(56) References Cited

U.S. PATENT DOCUMENTS

| | | | | |
|---|---|---|---|---|
| 6,720,942 | B2 * | 4/2004 | Lee et al. | 345/82 |
| 7,897,961 | B2 * | 3/2011 | Vogel et al. | 257/40 |
| 2005/0199876 | A1 * | 9/2005 | Matsumoto | 257/64 |
| 2006/0132671 | A1 * | 6/2006 | Koma | 349/63 |

FOREIGN PATENT DOCUMENTS

| | | |
|---|---|---|
| JP | A-11-121731 | 4/1999 |
| JP | B2-3561302 | 9/2004 |

* cited by examiner

*Primary Examiner* — Georgia Y Epps
*Assistant Examiner* — Don Williams
(74) *Attorney, Agent, or Firm* — Oliff & Berridge, PLC

(57) ABSTRACT

A light source integrated photoelectric conversion apparatus is provided, which includes: a light-emitting element that includes a light-emitting layer, and emits light in a predetermined emission direction through one surface of the light-emitting layer; and a plurality of photoelectric conversion elements that includes a photoelectric conversion layer formed on a region which is not overlapped with the light-emitting layer, and converts light having passed through one surface of the photoelectric conversion layer into an electrical signal. In the light source integrated photoelectric conversion apparatus, the light-emitting element is formed on the same substrate as that of the plurality of photoelectric conversion element, one surface of the photoelectric conversion layer is disposed on the side opposite to the emission direction further away from the other surface of the light-emitting layer, and one surface of the light-emitting layer and the substrate face each other.

17 Claims, 4 Drawing Sheets

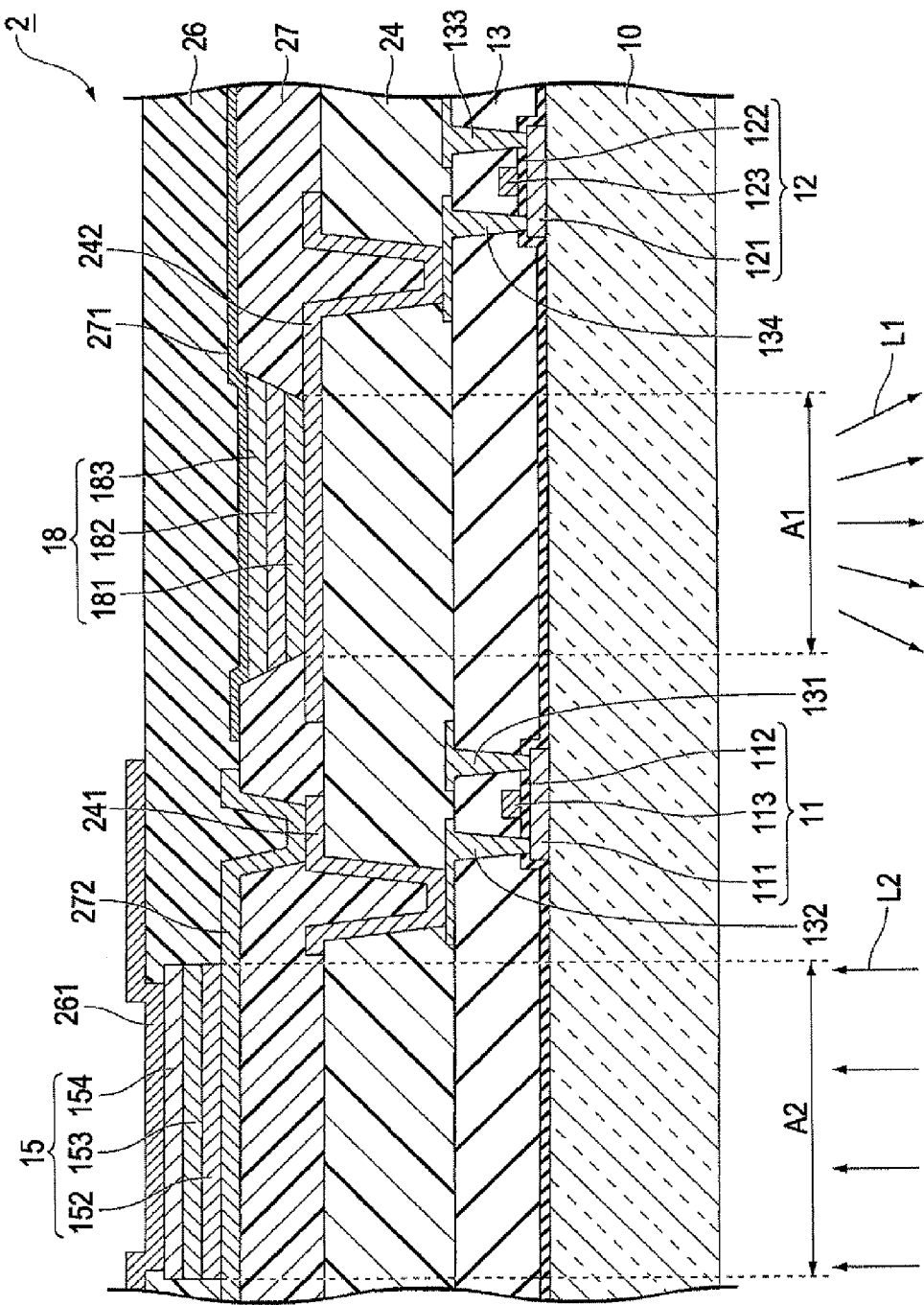

LIGHT SOURCE INTEGRATED PHOTOELECTRIC CONVERSION APPARATUS

BACKGROUND

1. Technical Field

The invention relates to a light source integrated photoelectric conversion apparatus.

2. Related Art

In the past, image sensors using a photoelectric conversion element such as a photodiode have been proposed (see, for example, JP-A-11-121731). An image sensor disclosed in JP-A-11-121731 has a structure where a plurality of pixels is disposed in a matrix shape. Each of a plurality of pixels is provided with the photodiodes. Optical signals detected by a plurality of photodiodes can be read out for each photodiode by a matrix circuit.

In order to read patterns of a reading object exactly in the image sensor, it is important to uniformly illuminate the reading object with high illuminance. This is because, the higher the intensity of light reflected on the surface of the reading object becomes, the more easily this light is detected by the photodiode.

As an image sensor including thin-film light-emitting elements which illuminate the reading object, Japanese Patent No. 3,561,302 has proposed a light source integrated solid-state imaging device. The light source integrated solid-state imaging device disclosed in Japanese Patent No. 3,561,302 has a structure where a pair of substrates is bonded by a transparent body. A plurality of solid-state imaging elements constituted by phototransistors, and a reading drive circuit of the solid-state imaging elements are formed on one of the substrates. Electroluminescence films are formed on the other substrate.

Using the technique of Japanese Patent No. 3,561,302 allows the object such as a document to be illuminated by the light emitted from the electroluminescence film. Therefore, it is contemplated that the intensity of light reflected on a document is secured, to thereby allow the document to be exactly read by the solid-state imaging element. However, in the technique of Japanese Patent No. 3,561,302, from the perspective of enhancing resolution and thinning of an apparatus, there are points needing improvement.

In the technique of Japanese Patent No. 3,561,302, since a pair of substrates is bonded by a transparent body, it is difficult to achieve thinning of an apparatus due to the thickness of the substrate or the thickness of the transparent body. Further, in a process bonding a pair of substrates, high accurate aligning technique is required, and thereby the cost of manufacturing may be increased. Supposing the aligning accuracy of a pair of substrates is lacking, a portion of pixels is overlapped with the electroluminescence element, to thereby become nonfunctional. In addition, supposing the margin for positional deviation is increased, there may be a possibility of causing disadvantages that the pixel size becomes smaller by the increased margin and sensitivity becomes low, or the number of pixels becomes small and the resolution becomes low.

SUMMARY

An advantage of some aspects of the invention is that it provides a light source integrated photoelectric conversion apparatus capable of detecting light corresponding to an object with accuracy, and capable of being further thinned.

According to a first aspect of the invention, a light source integrated photoelectric conversion apparatus is provided, which includes: a light-emitting element that includes a light-emitting layer, and emits light in a predetermined emission direction through one surface of the light-emitting layer; and a plurality of photoelectric conversion elements that includes a photoelectric conversion layer formed on a region which is not overlapped with the light-emitting layer, and converts light having passed through one surface of the photoelectric conversion layer into an electrical signal. In the light source integrated photoelectric conversion apparatus, the light-emitting element is formed on the same substrate as that of the plurality of photoelectric conversion element, one surface of the photoelectric conversion layer is disposed on the side opposite to the emission direction further away from the other surface of the light-emitting layer, and one surface of the light-emitting layer and the substrate face each other.

With this configuration, the light emitted from the light-emitting element is reflected on the surface of the object, and enters the photoelectric conversion layer to be converted into the electrical signal by the photoelectric conversion elements. The light corresponding to the object can then be detected by the electrical signal output from a plurality of photoelectric conversion elements.

According to the above-mentioned configuration, since the light-emitting element is formed on the same substrate as that of a plurality of photoelectric conversion elements, it is possible to reduce the number of substrates required for forming the elements, and to thin the apparatus, compared to a case where the light-emitting element is formed on the substrate independent of the photoelectric conversion elements. In addition, compared to a case where a substrate provided with the light-emitting element and a substrate provided with the photoelectric conversion elements are bonded, it is possible to omit a bonded portion between the substrates, and to thin the apparatus by the thickness of the bonded portion.

In addition, since the light-emitting element is formed on the same substrate as that of a plurality of photoelectric conversion elements, accuracy of a relative position between the light-emitting element and the photoelectric conversion elements becomes high. Therefore, it is possible to make smaller the margin for an error of the relative position between the light-emitting element and the photoelectric conversion elements, and to make an area of the photoelectric conversion layer larger or to increase the number of photoelectric conversion elements. Making an area of the photoelectric conversion layer larger can raise sensitivity of the photoelectric conversion elements, and increasing the number of photoelectric conversion elements can raise a resolution. Hereby, it is possible to detect the light corresponding to the object with accuracy.

In addition, since one surface of the photoelectric conversion layer is disposed on the side opposite to the emission direction further away from the other surface of the light-emitting layer, the light emitted from the light-emitting layer hardly enters the photoelectric conversion layer. Therefore, most of the light entering the photoelectric conversion layer becomes the light reflected on the surface of the object, to thereby allow the light corresponding to the object to be detected with accuracy.

In addition, it is preferable that a light shielding layer which covers the entirety of the other surface of the light-emitting layer and is composed of formation materials including at least one of a light-absorptive material and a light-reflective material is provided between the other surface of the light-emitting layer and one surface of the photoelectric conversion layer.

With this configuration, the light facing toward one surface of the photoelectric conversion layer through the other surface of the light-emitting layer does not pass through the light shielding layer. Therefore, the light emitted light-emitting layer does not go via the object and the amount of the light entering the photoelectric conversion layer directly is reduced, to thereby allow the light corresponding to the object to be detected with accuracy.

In addition, it is preferable that the light-emitting layer is formed on the inside of a partition wall composed of formation materials including at least one of a light-absorptive material and a light-reflective material.

With this configuration, the light emitted toward the partition wall from the light-emitting layer does not pass through the partition wall. Therefore, the light emitted toward the partition wall from the light-emitting layer is prevented from entering the photoelectric conversion layer, to thereby allow the light corresponding to the object to be detected with accuracy.

In addition, it is preferable that a drive switching element that switches a drive signal of the light-emitting element is disposed on the side opposite to the emission direction further away from one surface of the light-emitting layer.

With this configuration, since the drive switching element is disposed on the side opposite to the emission direction further away from one surface of the light-emitting layer, the light emitted from the light-emitting layer to the emission direction is not blocked by the drive switching element. Therefore, since an aperture ratio of the light-emitting element becomes substantially high, the object can be illuminated brightly. Further, since the light is not blocked by the drive switching element, less light is wasted, thereby reducing power consumption.

In addition, since the waste of the light lessens, it is possible to make an area of the light-emitting layer small while securing the light intensity required for illumination. Hereby, it is possible to make an area of the photoelectric conversion layer larger or to increase the number of photoelectric conversion elements as much as reduction of an area of the light-emitting layer. Hereby, it is possible to detect the light corresponding to the object with accuracy.

Additionally, in the light source integrated photoelectric conversion apparatus, it is preferable to further include a readout circuit which reads out an electrical signal output from each of the plurality of photoelectric conversion elements. The readout circuit is preferably disposed on the side opposite to the emission direction further away from one surface of the photoelectric conversion layer.

Generally, wiring lines or switching elements used in a circuit are composed of materials difficult for light to pass through. According to the above-mentioned configuration, since the readout circuit is disposed on the side opposite to the emission direction further away from one surface of the photoelectric conversion layer, the light prior to entering the photoelectric conversion layer is not blocked by the readout circuit. Therefore, since the light intensity of the light entering the photoelectric conversion layer is increased, sensitivity of the photoelectric conversion elements becomes high. In addition, it is possible to make an area of the photoelectric conversion layer smaller and to increase the number of photoelectric conversion elements, as much as an increase of the light intensity of the light entering photoelectric conversion layer. Hereby, it is possible to detect the light corresponding to the object at a high resolution.

It is preferable that the light-emitting element is an organic electroluminescence element.

The organic electroluminescence element can be formed using a low-temperature process such as a liquid phase method. In the invention, the light-emitting element and the photoelectric conversion elements are formed on the same substrate. However, according to the above-mentioned configuration, adverse effects on the photoelectric conversion elements due to heat at the time of forming the light-emitting element are dramatically diminished.

BRIEF DESCRIPTION OF THE DRAWINGS

The invention will be described with reference to the accompanying drawings, wherein like numbers reference like elements.

FIG. 4 is a schematic diagram showing the outline configuration of the image sensor according to the second embodiment.

DESCRIPTION OF EXEMPLARY EMBODIMENTS

Figure 1:
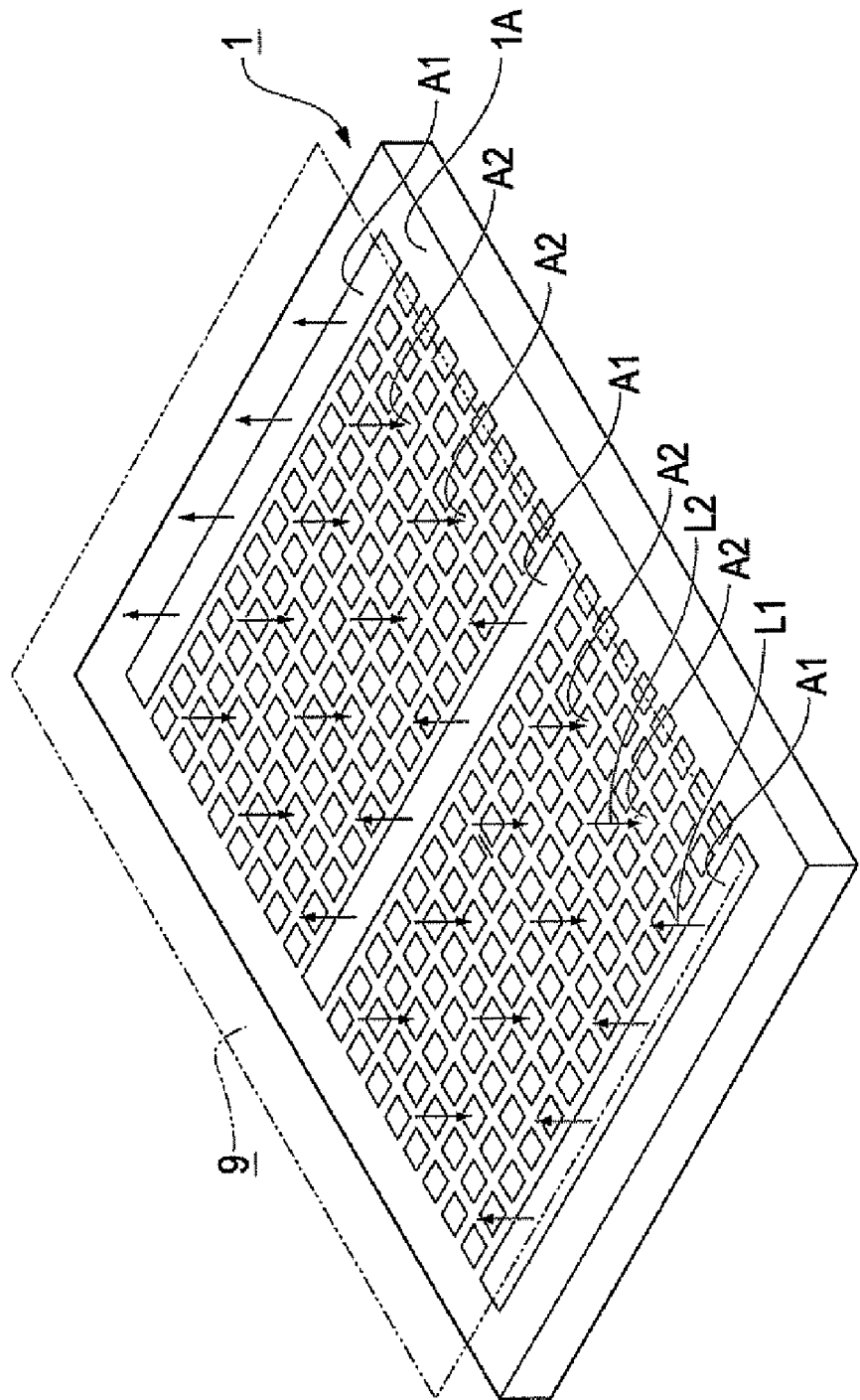
FIG. 1 is a schematic diagram showing the outline configuration of an image sensor according to the first embodiment.

Hereinafter, although the embodiments of the invention will be described, the technical scope of the invention is not limited to the embodiments to follow. In the descriptions below, although various types of structures are illustrated using the drawings, dimensions or scales of the structures in the drawings may be shown differently with respect to the actual structures for the purpose of clarifying the characteristic portions of the structures.

First Embodiment

FIG. 1 is a schematic diagram showing an outline configuration of an image sensor (light source integrated photoelectric conversion apparatus) 1 according to the first embodiment of the invention. As shown in FIG. 1, the image sensor 1 has an opposite surface 1A opposite to an object 9. The object 9 is a document or the like on which, for example, characters or images are printed. The opposite surface 1A of the embodiment is substantially rectangular in its planar shape. The opposite surface 1A includes a plurality of light-emitting regions A1 and a large number of light detection regions A2.

The light-emitting regions A1 extend substantially parallel to a short-side direction of the opposite surface 1A, and are lined up in a long-side direction of the opposite surface 1A. Here, a total of three light-emitting regions A1 are disposed on each of the marginal portions in the vicinity of two short sides of the opposite surface 1A, and on a central portion of the opposite surface 1A.

A plurality of light detection regions A2 is arranged in a matrix shape between the light-emitting regions A1 disposed on the marginal portions of the opposite surface 1A and the light-emitting region A1 disposed on the central portion of the opposite surface 1A. A plurality of light detection regions A2 is arranged in a short-side direction of the opposite surface 1A, and is arranged in a long-side direction of the opposite surface 1A. Here, each of the light detection regions A2 corresponds to one pixel of the image sensor 1.

The light-emitting elements described later are disposed on the portions overlapped with the light-emitting regions A1 in the image sensor 1. The photodiodes (photoelectric conversion elements) described later are disposed on the portions overlapped with the light detection regions A2 in the image sensor 1. The light-emitting elements are configured to emit light L1 from the opposite surface 1A toward the object 9. That is to say, the emission direction of the light L1 is a direction facing from the inside of the image sensor 1 to the outside thereof through the opposite surface 1A. Here, the opposite surface 1A is substantially parallel to the substrate surface of a substrate 10 (see FIG. 2) described later, and the normal direction of the substrate surface of the substrate 10 corresponds to the emission direction.

The light L1 emitted from the light-emitting region A1 enters the surface of the object 9. A portion of the light L1 entering the surface of the object 9 is reflected on the surface of the object 9, and a portion of the light L1 is absorbed into the object 9. Light L2 reflected on the surface of the object 9 enters the photodiode from the light detection region A2 and is converted into a charge (electrical signal). It is possible to detect the light corresponding to the object 9 by reading out the electrical signal corresponding to each of a plurality of light detection regions A2. For example, an image including characters or images printed on the document is obtained by this electrical signal. Hereinafter, components of the image sensor 1 will be described in details.

Figure 2:
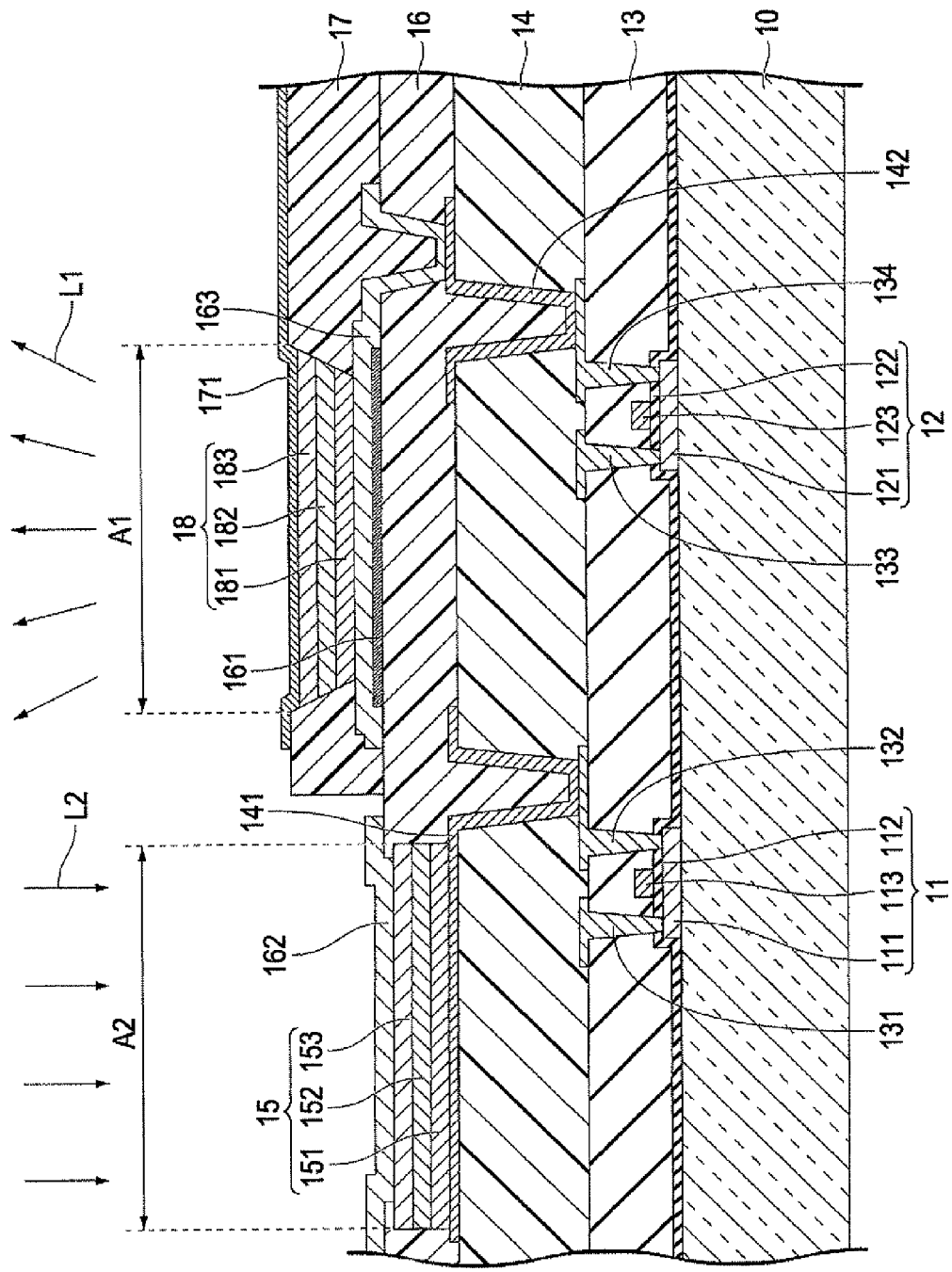
FIG. 2 is a cross-section view of the image sensor corresponding to a portion overlapped with a light-emitting region and a light detection region.

FIG. 2 is an enlarged cross-section view showing a main part of a cross-section structure of a portion overlapped with the light-emitting region A1 and a potion overlapped with the light detection region A2 in the image sensor 1.

As shown in FIG. 2, the image sensor 1 is manufactured using the substrate 10 composed of a glass and the like as a base. A light-detection TFT element 11 and a light-source TFT element (drive switching element) 12 are provided on the substrate 10. There is provided an interlayer insulating film 13, composed of a silicon oxide ($SiO_2$) and the like, with which the light-detection TFT element 11 and the light-source TFT element 12 are covered. A planarizing layer 14 composed of a resin material and the like is provided on the interlayer insulating film 13. A photoelectric conversion layer 15 constituting the photodiode is provided on the planarizing layer 14. Here, the photoelectric conversion layer 15 is disposed in a region overlapped with the light detection region A2.

A passivation film 16 composed of a silicon oxide and the like is continuously provided on the marginal portions of the photoelectric conversion layer 15 and on the planarizing layer 14. A partition wall 17 is provided on the passivation film 16. An organic functional layer 18 constituting the light-emitting element is provided in a region surrounded by the partition wall 17 on the passivation film 16. A light-emitting layer 183 is included in the organic functional layer 18. The organic functional layer 18 is disposed in a region overlapped with the light-emitting region A1. Here, the entirety of the organic functional layer 18 is configured not to be planarly overlapped with the entirety of the photoelectric conversion layer 15. Meanwhile, in a state of planar view from the emission direction, at least a portion of the photoelectric conversion layer 15 has only to be configured not to be overlapped with the light-emitting layer 183.

The light-detection TFT element 11 constitutes a portion of the readout circuit described later. The light-detection TFT element 11 includes a semiconductor layer 111, a gate insulating layer 112, and a gate electrode 113. The light-detection TFT element 11 of the embodiment is constituted by a thin-film transistor (TFT) which is formed using a low-temperature polysilicon (LTPS) technique.

The semiconductor layer 111 is composed of, for example, a polysilicon, and is provided on the substrate 10 in an island shape. Here, the semiconductor layer 111 is formed in order for all or a portion of the semiconductor layer 111 to be overlapped with the light detection region A2. The gate insulating layer 112 is composed of, for example, a silicon oxide, and is provided by covering the semiconductor layer 111. The gate electrode 113 is composed of a conductive material such as a polysilicon or a metallic material (for example, aluminum) into which impurities are injected in high concentration.

The gate electrode 113 is disposed on a position overlapped with a portion of the semiconductor layer 111 on the gate insulating layer 112. The semiconductor layer 111 of a portion overlapped with the gate electrode 113 corresponds to a channel region. In the semiconductor layer 111, one region where the channel region is inserted corresponds to a source region, and the other region corresponds to a drain region.

The light-source TFT element 12 includes a semiconductor layer 121, a gate insulating layer 122, and a gate electrode 123. The gate electrode 123 of the light-source TFT element 12 is electrically connected to a drive circuit of the light-emitting element.

The drive circuit of the light-emitting element is configured to turn on and off the light-source TFT element 12 at a predetermined timing. The predetermined timing can be appropriately set up in accordance with the disposition or the number of the light-emitting elements, an application of the image sensor 1 and the like. For example, the predetermined timing may be set up in order to turn on and off the light-source TFT element 12 in synchronization with an operation of the photodiode. In addition, during an operation of the image sensor 1, the predetermined timing may be set up at any time in order to turn on the light-source TFT element 12.

The light-source TFT element 12 of the embodiment is collectively formed by the same process as that of the light-detection TFT element 11. That is to say, the semiconductor layers 111 and 121 are collectively formed by patterning a polysilicon film formed on the substrate 10. Here, the semiconductor layer 121 is formed in order for all or a portion of the semiconductor layer 121 to be overlapped with the light-emitting region A1. The gate insulating layer 112 and 122 are formed by covering the semiconductor layer 111 and 121, and are substantially integrated with each other. The gate electrode 113 and 123 are collectively formed by patterning a conductive film formed on the gate insulating layer 112 and 122.

Conductive portions 131, 132, 133, and 134 are provided by penetrating the interlayer insulating film 13, and the gate insulating layer 112 and 122. The conductive portion 131 and 132 are continuously provided on the insides of contact holes penetrating the interlayer insulating film 13 and the gate insulating layer 112, and on the interlayer insulating film 13. The conductive portion 133 and 134 are continuously provided on the insides of contact holes penetrating the interlayer insulating film 13 and the gate insulating layer 122, and on the interlayer insulating film 13.

The conductive portion 131, 132, 133, and 134 are collectively formed by the same process. For example, by penetrating the interlayer insulating film 13 and the gate insulating layer 112, contact holes exposing the source region and the drain of the region semiconductor layer 111, and the source region and the drain region of the semiconductor layer 121, respectively, are formed. Next, the conductive material is continuously coated on the insides of the contact holes and on the interlayer insulating film 13 so as to form the conductive film. The conductive portions 131, 132, 133, and 134 are then collectively formed by patterning this conductive film.

The conductive portion 131 is conductively connected to the drain region of the semiconductor layer 111 of the light-detection TFT element 11. The conductive portion 132 is conductively connected to the source region of the semiconductor layer 111 of the light-detection TFT element 11. The conductive portion 133 is conductively connected to the source region of the semiconductor layer 121 of the light-source TFT element 12. At the same time, the conductive portion 134 electrically connected to a power supply (not shown) is conductively connected to the drain region of the semiconductor layer 121 of the light-source TFT element 12.

The conductive portions 141 and 142 are provided by penetrating the planarizing layer 14. The conductive portions 141 and 142 each are continuously provided on the insides of the contact holes provided in the planarizing layer 14 and on the planarizing layer 14. The conductive portion 141 is conductively connected to the conductive portion 132, and is electrically connected to the source region of the semiconductor layer 111 via the conductive portion 132. The conductive portion 141 is extended up to a region overlapped with the light detection region A2 on the planarizing layer 14. The conductive portion 142 is conductively connected to the conductive portion 134, and is electrically connected to the drain region of the semiconductor layer 121 via the conductive portion 134.

The conductive portion 141 of the embodiment is provided by covering the entirety of the light-detection TFT element 11. The conductive portion 141 is composed of a conductive material including at least one of a light-reflective material reflecting the light and a light-absorptive material absorbing the light. Hereby, the light does not enter the light-detection TFT element 11 from the conductive portion 141 side, and malfunction of the light-detection TFT element 11 due to the entrance of the light is prevented.

Here, both of the conductive portions 141 and 142 are composed of aluminum (light-reflective material), and are collectively formed. For example, the contact holes are formed which penetrate the planarizing layer 14, and expose the conductive portions 132 and 134 of portions drawn out on the interlayer insulating film 13. Next, aluminum is continuously coated on the insides of the contact holes and on the planarizing layer 14 so as to form an aluminum film. Next, the conductive portions 141 and 142 are obtained by patterning this aluminum film.

The photoelectric conversion layer 15 is provided on the conductive portion 141 of a portion extended over the planarizing layer 14. The photoelectric conversion layer 15 is constituted by a p-type semiconductor layer 151 provided on the conductive portion 141, an i-type semiconductor layer 152 provided on the p-type semiconductor layer 151, and an n-type semiconductor layer 153 provided on the i-type semiconductor layer 152. In the embodiment, all of the p-type semiconductor layer 151, the i-type semiconductor layer 152, and the n-type semiconductor layer 153 are composed of microcrystalline silicon. In the p-type semiconductor layer 151, Group III impurities (for example, boron) are doped. In the n-type semiconductor layer 153, Group V impurities (for example, phosphorus) are doped.

The passivation film 16 is continuously provided on the marginal portions of the photoelectric conversion layer 15 and on the planarizing layer 14. In the passivation film 16, an aperture exposing the n-type semiconductor layer 153 of the photoelectric conversion layer 15 is provided. A conductive portion 162 composed of a conductive material having light transmittance such as an indium tin oxide (ITO) is continuously provided on the n-type semiconductor layer 153 exposed to the inside of this aperture, and on the passivation film 16.

The photodiode is constituted by the conductive portion 141, the photoelectric conversion layer 15, and the conductive portion 162. When the light L2 enters one surface of the photoelectric conversion layer 15, the number of carriers occurring in the photoelectric conversion layer 15 depends on the light intensity of the light L2. These carriers can be taken out as an electrical signal via the conductive portions 141 and 162. In this manner, the conductive portions 141 and 162 function as electrodes of the photodiode.

A light shielding layer 161 is provided in a region overlapped with the light-emitting region A1 on the passivation film 16. The light shielding layer 161 is composed of a formation material including at least one of the above-mentioned light-reflective material (for example, aluminum) and the light-absorptive material (for example, nickel chrome). The formation material of the light shielding layer 161 may be any of a conductive material, a semiconductor material, or an insulating material. The light shielding layer 161 of the embodiment is composed of aluminum.

A conductive portion 163 is provided which penetrates the passivation film 16 and is composed of a conductive material having light transmittance. The conductive portion 163 exposes the conductive portion 142 of a portion drawn out on the planarizing layer 14, and is provided on the inside of the contact hole penetrating the passivation film 16. The conductive portion 163 is continuously provided on the inside of the contact hole, on the passivation film 16, and on the light shielding layer 161. The conductive portion 163 is extended up to a region overlapped with the light-emitting region A1 on the passivation film 16 or on the light shielding layer 161. The conductive portion 163 is conductively connected to the conductive portion 142, and is electrically connected to the drain region of the light-source TFT element 12 via the conductive portion 142 and the conductive portion 134.

The conductive portion 163 of the embodiment is composed of an indium tin oxide, and is collectively formed with the conductive portion 162. For example, after the photoelectric conversion layer 15 is formed, the passivation film 16 is continuously formed on the photoelectric conversion layer 15 and the planarizing layer 14. Next, the passivation film 16 is opened and the photoelectric conversion layer 15 is exposed. At the same time, the contact hole which penetrates the passivation film 16 and exposes the conductive portion 142 is formed. In addition, the light shielding layer 161 is formed on the passivation film 16. Next, a film of an indium tin oxide is collectively formed on the light shielding layer 161, the passivation film 16, the inside of the aperture, and the inside of the contact hole. The conductive portions 162 and 163 can be then collectively formed by patterning this indium tin oxide film.

The partition wall 17 is provided on the passivation film 16. The partition wall 17 is composed of a light-transmitting resin material. The partition wall 17 is disposed so as not to be overlapped with the photoelectric conversion layer 15. The partition wall 17 has an aperture exposing the conductive portion 163 in a portion overlapped with the light-emitting region A1. On the inside of this aperture, the organic functional layer 18 is provided. Meanwhile, a formation material having the light-shielding properties, for example, an inorganic material including a light-reflective material or a resin material including a black pigment (light-absorptive material) may be used as a formation material of the partition wall 17.

The organic functional layer 18 of the embodiment includes a hole-injection layer 181 provided on the conductive portion 163, a hole transport layer 182 provided on the hole-injection layer 181, and the light-emitting layer 183 provided on the hole transport layer 182. The hole-injection layer 181 and the hole transport layer 182 are composed of formation materials heretofore known. The light-emitting layer 183 is composed of organic electroluminescence materials heretofore known. The organic functional layer 18 is formed by a low-temperature process such as a droplet emitting method. Hereby, the photoelectric conversion layer 15, the light-detection TFT element 11, and the light-source TFT element 12 or the like formed ahead of the organic functional layer 18 are not deteriorated or damaged by the heat upon forming the organic functional layer 18.

A conductive portion 171 is continuously provided on the partition wall 17 and the light-emitting layer 183. The conductive portion 171 is composed of a conductive material having light transmittance such as, for example, silver magnesium. The light-emitting element (organic electroluminescence element) is constituted by the conductive portion 163, the organic functional layer 18, and the conductive portion 171. The conductive portion 163 is configured to function as an anode, and the conductive portion 171 is configured to function as a cathode.

In the light-emitting element described above, when the light-source TFT element 12 is turned on by the drive circuit of the light-emitting element, a voltage is applied between the conductive portion 163 and the conductive portion 171 from the power supply via the conductive portion 133, the channel region of the light-source TFT element 12, and the conductive portion 134, 142 and 163. Then, the holes are supplied from the conductive portion 163 to the hole-injection layer 181, and the electrons are supplied from the conductive portion 171 to the light-emitting layer 183. The conductive portion 163 is composed of an indium tin oxide which is a material having a high work function, and the holes are efficiently supplied from the conductive portion 163 to the hole-injection layer 181. The holes supplied to the hole-injection layer 181 are transported to the light-emitting layer 183 via the hole transport layer 182. The holes transported to the light-emitting layer 183 are bound with the electrons supplied from the conductive portion 171 within the light-emitting layer 183, so that the binding energy is generated. The organic electroluminescence material included in the light-emitting layer 183 is excited by this binding energy, to thereby generate the light.

The light emitted from the light-emitting layer 183 toward the conductive portion 171 is emitted through the conductive portion 171. The light emitted toward the conductive portion 163 is reflected and reflexed on the light shielding layer 161 composed of aluminum, and is emitted through the conductive portion 171. When the partition wall 17 is formed by a material including a light-absorptive material or a light-reflective material, the light emitted toward the partition wall 17 is absorbed into the partition wall 17, and is not emitted outside the partition wall 17. In this manner, the light L1 is emitted through the light-emitting region A1 from the light-emitting element.

Figure 3:
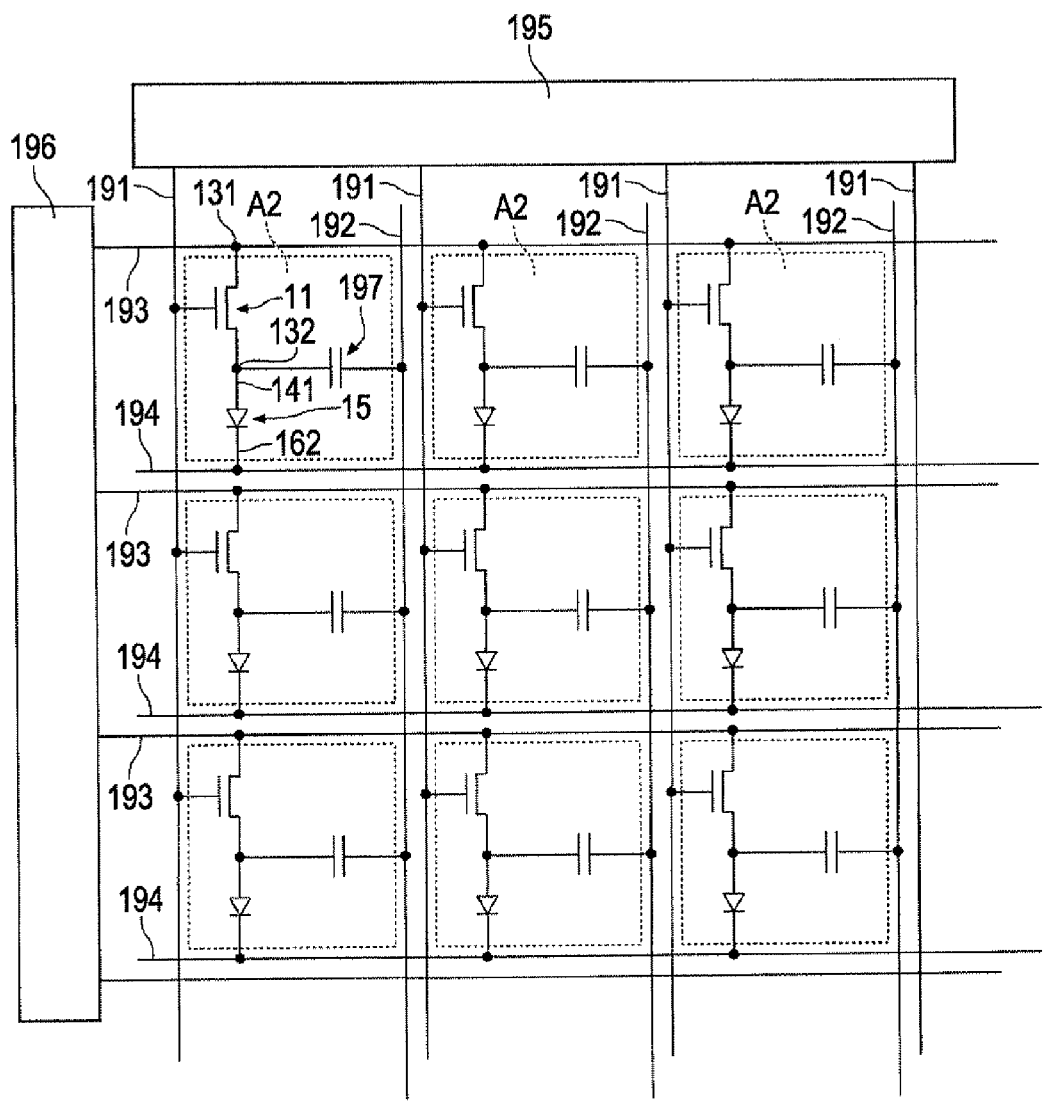
FIG. 3 is a schematic diagram showing the configuration of a readout circuit of the image sensor.

FIG. 3 is a schematic diagram showing the configuration of the readout circuit for reading out the output from the photodiode in the image sensor 1.

As shown in FIG. 3, the readout circuit includes a plurality of scanning lines 191 extended parallel to each other, and a plurality of capacitive lines 192 extended parallel to the scanning lines 191. The reading circuit includes a plurality of data lines 193 extended perpendicular to the scanning lines 191, and a plurality of constant potential lines 194 extended parallel to the data lines 193. A region surrounded by the scanning line 191 and the data line 193 corresponds to the light detection region A2. Meanwhile, the extended direction of the light-emitting region A1 substantially coincides with the extending direction of the scanning line 191, and the light-emitting region A1 is disposed straddling a plurality of data lines 193.

One end of the scanning line 191 is electrically connected to a scanning line drive circuit 195. The scanning line drive circuit 195 has a shift register, a level shifter, a video line and an analog switch or the like. The scanning line drive circuit 195 supplies a scanning signal to a plurality of scanning lines 191 in the line-sequential manner. One end of the data line 193 is electrically connected to a data line drive circuit 196.

The light-detection TFT element 11 is disposed in the vicinity of a region where the scanning line 191 intersects the data line 193 in the light detection region A2. The gate electrode 113 (see FIG. 2) of the light-detection TFT element 11 is electrically connected to the scanning line 191. The scanning line 191 of the embodiment is formed integrally with the gate electrode 113. For example, with the conductive film being left in a formation region of the scanning line 191 upon forming the gate electrodes 113 and 123, the scanning line 191 integrated with the gate electrode 113 can be collectively formed with the gate electrode 123 by patterning the conductive film.

The drain region of the light-detection TFT element 11 is electrically connected to the data line 193. The source region of the light-detection TFT element 11 is electrically connected to the conductive portion 141 which is one electrode of the photodiode, and is electrically connected to one end of a retentive capacity 197. The other end of the retentive capacity 197 is electrically connected to the capacitive line 192. The conductive portion 162 which is the other electrode of the photodiode is electrically connected to the constant potential line 194. The conductive portion 162 is retained at a constant potential via the constant potential line 194, and the reverse bias voltage is applied to the photoelectric conversion layer 15.

When the light L2 enters the photoelectric conversion layer 15 shown in FIG. 2, the charges are generated in the photoelectric conversion layer 15. The reverse bias voltage is applied to the photoelectric conversion layer 15, and the retentive capacity 197 is charged by the charges generated in the photoelectric conversion layer 15. When the scanning signal is supplied from the scanning line drive circuit 195 to the scanning line 191, a plurality of light-detection TFT elements 11 connected to this scanning line 191 is turned on. When the light-detection TFT element 11 is turned on, the current flows from the retentive capacity 197 to the data line 193, and this current is read out as an electrical signal to the data line drive circuit 196. Hereby, the electrical signals are concurrently read out from a plurality of light-detection TFT elements 11 connected to one scanning line 191.

After the electrical signals are read out from the light-detection TFT elements 11 corresponding to one scanning line 191, a plurality of data lines 193 is discharged and retained at a predetermined potential. After a plurality of data lines 193 reaches a predetermined potential, the scanning signals are supplied to the next scanning line 191 from the scanning line drive circuit 195. Hereinafter, the electrical signals corresponding to each of the charges similarly generated in a plurality of photoelectric conversion layers 15 are read out in order.

In the image sensor 1 of the described-above configuration, since the surface which the light enters in the photoelectric conversion layer 15 is disposed on the side opposite to the emission direction of the light L1 further away from the light-emitting layer 183, the light L1 hardly enters the photoelectric conversion layer 15. Therefore, most of the light entering the photoelectric conversion layer 15 becomes the light L2 reflected on the surface of the object 9, to thereby allow the light corresponding to the object 9 to be detected with accuracy.

In addition, the light-emitting element is formed on the same substrate 10 as that of the photodiode. For this reason, compared to an apparatus where the substrate on which the light-emitting element is formed and the substrate on which the photodiode is formed are bonded, the substrate or a bonded portion therebetween can be omitted, and the thinning of image sensor 1 is obtained.

Since the light-emitting element is formed on the same substrate 10 as that of the photodiode, the relative position between the light-emitting element and the photodiode has a high degree of accuracy. Therefore, it is possible to make smaller the margin for an error of the relative position between the light-emitting element and the photodiode, and to raise the proportion of the light-emitting region A1 or the proportion of the light detection region A2 to the opposite surface 1A. Raising the proportion of the light-emitting region A1 allows the object 9 to be illuminated with high illuminance, and causes accuracy of light detection by the photoelectric conversion layer 15 to become higher. In addition, raising the light detection region A2 allows the increase in area or the high resolution of the photoelectric conversion layer 15 to be achieved, and also allows the light corresponding to the object 9 to be detected with accuracy.

The light-source TFT element 12 is disposed on the side opposite to the emission direction of the light L1 with respect to the light-emitting element, and the light-emitting element is configured to be a top-emission type. For this reason, it is possible to raise the aperture ratio of the light-emitting element, and to illuminate the object 9 with high illuminance. In addition, the light-emitting region A1 is disposed on the marginal portions and the central portion of the opposite surface 1A. Therefore, it is possible to uniformly illuminate the object 9.

The readout circuit of the photodiode is disposed on the side opposite to the side where the light L2 enters the photodiode. Therefore, it is possible to raise the aperture ratio of the photodiode, and to raise sensitivity of the photodiode.

As described above, the image sensor 1 of the first embodiment is capable of thinning, and the light corresponding to the object 9 can be detected with a high degree of accuracy. For example, when the object 9 is a printed matter, it is possible to exactly read characters or images recorded in the printed matter by the image sensor 1. In addition, when the object 9, for example, is a finger, it is possible to exactly read a fingerprint by the image sensor 1, and to perform biometric identification with a high degree of accuracy, and the like.

Second Embodiment

Next, the image sensor (light source integrated photoelectric conversion apparatus) according to the second embodiment of the invention will be described. A point that the second embodiment is different from the first embodiment is that the light-emitting element is a bottom-emission type.

FIG. 4 is a cross-section view showing a main part of an outline configuration of the image sensor 2 according to the second embodiment. Meanwhile, in FIG. 4 the same components as those of the first embodiment are attached to the same numbers as those of the first embodiment. In addition, the detailed description of the same components as those of the first embodiment may be omitted.

As shown in FIG. 4, the image sensor 2 is manufactured using substrate 10, which is composed of a glass or the like and has light transmittance, as a base. The light-detection TFT element 11 and the light-source TFT element 12 are provided on the substrate 10. The interlayer insulating film 13 is provided by covering the light-detection TFT element 11 and the light-source TFT element 12.

The interlayer insulating film 13 is provided with the conductive portion 132 electrically connected to the source region of the light-detection TFT element 11, the conductive portion 131 electrically connected to the drain region of the of the light-detection TFT element 11, the conductive portion 133 electrically connected to the source region of the light-source TFT element 12, and the conductive portion 134 electrically connected to the drain region of the light-source TFT element 12.

The planarizing layer 24, which is composed of a resin material (for example, acrylic resin) or the like and has light transmittance, is provided on the interlayer insulating film 13. The planarizing layer 24 is provided with the conductive portion 241 which penetrates the planarizing layer 24 and is conductively connected to the conductive portion 132, and the conductive portion 242 which penetrates the planarizing layer 24 and is conductively connected to the conductive portion 134. Both of the conductive portions 241 and 242 are composed of an indium tin oxide, and are formed by the same process. The conductive portion 242 is extended up to a region overlapped with the light-emitting region A1 on the planarizing layer 24, and becomes an anode of the light-emitting element.

The partition wall 27 composed of a resin material or the like having light transmittance is provided in the almost entire surface over the planarizing layer 24. The partition wall 27 is provided with an aperture exposing the conductive portion 241, and the organic functional layer 18 is provided on the inside of this aperture. The conductive portion 271 is continuously provided on the organic functional layer 18 within the aperture of the partition wall 27, and on the partition wall 27. The conductive portion 271 is composed of a light-reflective material such as aluminum, and becomes a cathode of the light-emitting element. The partition wall 27 is provided with the conductive portion 272 which penetrates the partition wall 27 and is conductively connected to the conductive portion 241. The conductive portion 272 is extended up to a region overlapped with the light detection region A2 on the partition wall 27, and becomes one electrode of the photodiode. The conductive portion 272 is composed of a conductive material (for example, indium tin oxide) having light transmittance.

The photoelectric conversion layer 15 is provided on the conductive portion 272. The passivation film 26 is provided by covering the marginal portions of the photoelectric conversion layer 15, the conductive portion 241, the conductive portion 271, and the partition wall 27. The passivation film 26 is provided with an aperture exposing the photoelectric conversion layer 15, and the conductive portion 261 is continuously provided on the inside of the aperture and on the passivation film 26. The conductive portion 261 is composed of a light-reflective material such as aluminum, and becomes the other electrode of the photodiode.

In the image sensor 2 of the described-above configuration, when the power is transferred to the organic functional layer 18 via the light-source TFT element 12 or the conductive portion 134 and 242, the light is generated in the light-emitting layer 183. The light emitted from the light-emitting layer 183 toward the conductive portion 242 is emitted through the conductive portion 242. The light emitted from the light-emitting layer 183 toward the conductive portion 271 is reflected and reflexed on the conductive portion 271, and is emitted through the conductive portion 242.

As described above, the light-emitting element of the second embodiment is configured to be a bottom-emission type, and the light L1 form the light-emitting element is emitted through the substrate 10. In the second embodiment, the emission direction of the light L1 is parallel to a normal direction of the substrate 10 and is a direction facing from inside of the image sensor 2 to the outside thereof. In addition, the light L2 entering the substrate 10 of a portion overlapped with the light detection region A2 from the outside of the image sensor 2 enters the photoelectric conversion layer 15.

In the image sensor 2 of the second embodiment, the surface which the light enters in the photoelectric conversion layer 15 is disposed on the side opposite to the emission direction of the light L1 further away from the light-emitting layer 183. For this reason, similarly to the first embodiment, it is possible to detect the light corresponding to the object 9 with a high degree of accuracy. In addition, since the light-emitting element and the photodiode are formed on the same substrate 10, it is possible to thin the apparatus, and to detect the light corresponding to the object 9 with a high degree of accuracy.

There can be adopted a material of the conductive portion 271 which is an electrode of the organic functional layer 18, the material having a light reflectivity or a light absorptivity. Generally, since metallic materials such as aluminum, gold, or silver are materials of which both reflectance and conductivity are high, it is possible to better the electrical characteristics of the light-emitting element compared to the first embodiment.

Meanwhile, in the first embodiment, although a plurality of light-emitting regions A1 extended parallel to each other is included in the marginal portions of the opposite surface 1A and the central portion, the number, the arrangement and the shapes of the light-emitting regions can be changed variously. For example, only one light-emitting region may exist, and a plurality of light-emitting elements may be disposed in a region overlapped with the light-emitting region. The light-emitting region may be disposed in only one place of the marginal portions of the opposite surface, and may be disposed in only one place of the central portion thereof. In addition, the light-emitting region having a frame shape may be disposed in the marginal portion of the opposite surface so as to annularly surround a plurality of light detection regions. Further, a plurality of light-emitting regions is disposed to be adjacent to each of a plurality of light detection regions.

In addition, the configuration of the readout circuit can be appropriately changed in accordance with a method of reading out the charges generated in the photoelectric conversion layer 15. For example, there can be adopted a reading circuit which includes circuit components amplifying the charges generated in the photoelectric conversion layer 15.

Further, the light-emitting diode (LED) and the like can be used as a light-emitting element. The light emitted from the light-emitting element may be sufficient to be in a wavelength range capable of being detected by the photoelectric conversion layer 15. For example, it is possible to design the characteristics of the photoelectric conversion layer in accordance with an application of the light source integrated photoelectric conversion apparatus, and to design the light-emitting element so as to emit the light corresponding to any one of a wavelength range of visible light, a wavelength range of infrared light, and a wavelength range of ultraviolet light in accordance with the characteristics of the photoelectric conversion layer.

Meanwhile, in the second embodiment, although the partition wall 27 composed of a formation material having light transmittance is adopted, the partition wall composed of a formation material having light-shielding properties similar to the first embodiment may be formed. In this case, the partition wall having light-shielding properties is formed in the periphery of the light-emitting element, and a region overlapped with the photoelectric conversion element may be provided with a layer having light transmittance in the same layer as this partition wall. A thickness (for example, hundreds of nm) of the light-emitting element may be dramatically smaller (for example, one over hundreds to one over dozens) than the dimension (for example, dozens of µm) of a surface direction of the light-emitting element. In such a case, not much of the light is emitted from a lateral face of the light-emitting layer. It is possible to appropriately select whether to make the partition wall have the light-shielding properties depending to the dimension of the light-emitting layer.

The entire disclosure of Japanese Patent Application No. 2008-327472, filed Dec. 24, 2008 is expressly incorporated by reference herein.

What is claimed is:

1. A light source integrated photoelectric conversion apparatus, comprising:
    a light-emitting element that includes a light-emitting layer, and emits light in a predetermined emission direction through one surface of the light-emitting layer;
    a light shielding layer; and
    a plurality of photoelectric conversion elements that includes a photoelectric conversion layer formed on a region which is not overlapped with the light-emitting layer, and converts light having passed through one surface of the photoelectric conversion layer into an electrical signal, wherein
        the light-emitting element is formed on a same substrate as that of the plurality of photoelectric conversion elements,
        one surface of the photoelectric conversion layer is disposed on the side opposite to the emission direction further away from the other surface of the light-emitting layer,
        one surface of the light-emitting layer and the substrate face each other, and
        the light shielding layer is provided between the other surface of the light-emitting layer and one surface of the photoelectric conversion layer.

2. The light source integrated photoelectric conversion apparatus according to claim 1, wherein the light shielding layer covers the entirety of the other surface of the light-emitting layer and is composed of formation materials including at least one of a light-absorptive material and a light-reflective material.

3. The light source integrated photoelectric conversion apparatus according to claim 1, wherein the light-emitting layer is formed on the inside of a partition wall composed of formation materials including at least one of a light-absorptive material and a light-reflective material.

4. The light source integrated photoelectric conversion apparatus according to claim 1, wherein a drive switching element that switches a drive signal of the light-emitting element is disposed on the side opposite to the emission direction, further away from one surface of the light-emitting layer.

5. The light source integrated photoelectric conversion apparatus according to claim 1, further comprising a readout circuit which reads out an electrical signal output from each of the plurality of photoelectric conversion elements, wherein the readout circuit is disposed on the side opposite to the emission direction further away from one surface of the photoelectric conversion layer.

6. The light source integrated photoelectric conversion apparatus according to claim 1, wherein the light-emitting element is an organic electroluminescence element.

7. The light source integrated photoelectric conversion apparatus according to claim 1, wherein the plurality of photoelectric conversion elements occupies a majority of a total area of the light source integrated photoelectric conversion apparatus.

8. The light source integrated photoelectric conversion apparatus according to claim 1, wherein the light source integrated photoelectric conversion apparatus has a substantially rectangular shape and the light-emitting element is disposed substantially across the middle of the photoelectric conversion apparatus.

9. The light source integrated photoelectric conversion apparatus according to claim 8, wherein the light-emitting element is disposed in a direction substantially parallel to a short side direction of the substantially rectangular shape of the light source integrated photoelectric conversion apparatus.

10. The light source integrated photoelectric conversion apparatus according to claim 1, wherein a majority of light entering the plurality of photoelectric conversion elements is a light that is reflected from an object positioned outside the light source integrated photoelectric conversion apparatus.

11. The light source integrated photoelectric conversion apparatus according to claim 10, wherein the object does not contact the light source integrated photoelectric conversion apparatus.

12. A light source integrated photoelectric conversion apparatus, comprising:
   a plurality of light-emitting elements, each of the plurality of light-emitting elements including a light-emitting layer, and emitting light in a predetermined emission direction through one surface of the light-emitting layer;
   a plurality of light shielding layers; and
   a plurality of photoelectric conversion elements that (i) occupies a majority of a total area of the light source integrated photoelectric conversion apparatus, (ii) each includes a photoelectric conversion layer formed on a region which is not overlapped with the light-emitting layer, and (iii) each converts light having passed through one surface of the photoelectric conversion layer into an electrical signal, wherein
   the plurality of light-emitting elements is formed on a same substrate as that of the plurality of photoelectric conversion elements,
   one surface of the photoelectric conversion layer is disposed on the side opposite to the emission direction further away from the other surface of the light-emitting layer,
   one surface of the light-emitting layer and the substrate face each other, and
   a light shielding member of the plurality of light shielding layers is provided between the other surface of the light-emitting layer and one surface of the photoelectric conversion layer.

13. The light source integrated photoelectric conversion apparatus according to claim 12, wherein the plurality of photoelectric conversion elements is arranged into at least two grid formations, each of the at least two grid formations being adjacent to one of the plurality of light-emitting elements, and being separated from one another by the one of the plurality of light-emitting elements.

14. The light source integrated photoelectric conversion apparatus according to claim 12, wherein the light source integrated photoelectric conversion apparatus has a substantially rectangular shape, and one of the plurality of light-emitting elements is disposed substantially across the middle of the photoelectric conversion apparatus.

15. The light source integrated photoelectric conversion apparatus according to claim 14, wherein the one of the plurality of light-emitting elements is disposed in a direction substantially parallel to a short side direction of the substantially rectangular shape of the light source integrated photoelectric conversion apparatus.

16. The light source integrated photoelectric conversion apparatus according to claim 12, wherein a majority of light entering the plurality of photoelectric conversion elements is a light that is reflected from an object positioned outside the light source integrated photoelectric conversion apparatus.

17. The light source integrated photoelectric conversion apparatus according to claim 16, wherein the object does not contact the light source integrated photoelectric conversion apparatus.

* * * * *